United States Patent
Komada et al.

(10) Patent No.: US 9,113,058 B2
(45) Date of Patent: Aug. 18, 2015

(54) PHOTOGRAPHING APPARATUS, AND VIBRATION CONTROL METHOD

(71) Applicant: Samsung Electronics Co., Ltd., Gyeonggi-do (KR)

(72) Inventors: Jun Komada, Yokohama (JP); Masahiro Shirono, Yokohama (JP)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 201 days.

(21) Appl. No.: 13/862,812

(22) Filed: Apr. 15, 2013

(65) Prior Publication Data

US 2013/0271639 A1    Oct. 17, 2013

(30) Foreign Application Priority Data

Apr. 13, 2012  (JP) ................................. 2012-091913
Apr. 9, 2013  (KR) ........................ 10-2013-0038748

(51) Int. Cl.
*H04N 5/217*  (2011.01)
*G03B 11/00*  (2006.01)
*G03B 17/02*  (2006.01)
*G02B 27/00*  (2006.01)
*H01L 41/09*  (2006.01)

(52) U.S. Cl.
CPC .......... *H04N 5/2171* (2013.01); *G02B 27/0006* (2013.01); *G03B 11/00* (2013.01); *G03B 17/02* (2013.01); *G03B 2205/0061* (2013.01); *H01L 41/09* (2013.01)

(58) Field of Classification Search
CPC ............... H04N 5/2171; H04N 5/2254; G02B 27/0006; G03B 2205/0061; G03B 11/00; G03B 17/02
See application file for complete search history.

(56) References Cited

U.S. PATENT DOCUMENTS

2010/0158501 A1*  6/2010  Kawai ........................... 396/448

FOREIGN PATENT DOCUMENTS

| JP | 3727903 B2 | 10/2005 |
|---|---|---|
| JP | 2007-074758 A | 3/2007 |
| JP | 2008-227867 A | 9/2008 |
| JP | 4253523 B2 | 1/2009 |
| JP | 2009-188949 A | 8/2009 |
| JP | 2010-098410 A | 4/2010 |
| JP | 2010-119049 A | 5/2010 |
| JP | 2010-263316 A | 11/2010 |
| JP | 2010-283654 A | 12/2010 |
| JP | 2011-015434 A | 1/2011 |
| JP | 2011-015435 A | 1/2011 |
| JP | 4759637 B2 | 6/2011 |
| JP | 4764265 B2 | 6/2011 |

* cited by examiner

*Primary Examiner* — Paul Berardesca
(74) *Attorney, Agent, or Firm* — Cha & Reiter, LLC.

(57) ABSTRACT

A photographing apparatus includes a supporting member which supports a photographing element such as an image sensor, a vibration means which vibrates an optical member provided on a front surface of the photographing element, and a control means which controls vibrations generated by the vibration means at two different frequencies, wherein the first frequency is around a natural frequency of the supporting member and the second frequency is around a natural frequency of the optical member.

17 Claims, 6 Drawing Sheets

PHOTOGRAPHING APPARATUS, AND VIBRATION CONTROL METHOD

CLAIM OF PRIORITY

This application claims priority from an earlier Japanese Patent Application No. 2012-091913, filed on Apr. 13, 2012 in the Japanese Patent Office, and an earlier Korean Patent Application No. 10-2013-0038748, filed on Apr. 9, 2013 in the Korean Intellectual Property Office, the disclosure of which is incorporated herein by reference in its entirety.

BACKGROUND OF THE INVENTION

1. Field of the Invention

The present invention relates to a photographing apparatus capable of vibrating an optical member to remove dust thereon, and a vibration control method of the optical member.

2. Description of the Related Art

Photographing devices such as digital still cameras and digital video cameras equipped with a charge-coupled device (CCD) with high pixels provide high definition images. A single lens is typically detachably installed in a main body of the photographing apparatus, so that a user may select and use a desired optical system (a lens unit) when photographing a particular object.

In the digital camera, when a lens is separate from the main body of the photographing apparatus, dust floating in the air may enter the main body of the photographing apparatus between exchanging the lenses. In addition, since there are components, such as a shutter and an aperture, that mechanically operate in the main body of the photographing apparatus, dust may be also generated when operating such components. When dust is exposed to a filter surface of the photographing element, the dust is captured on a photographed image.

In order to solve the above problem, digital interchangeable lens cameras have a dustproof member between the photographing element and the optical system to prevent dust from the photographing element and the filter, so that the dust attached to the dustproof member can be removed by vibration.

In the above conventional dust removing method, a frequency of the voltage applied to a piezoelectric element is driven on a resonant frequency of the dustproof member so that dust can be removed. However, since there is a physical limit to a frequency band capable of obtaining a desired step-up rate of a step-up transformer used in a driving circuit of the piezoelectric element, it is difficult to drive the circuit in a wider frequency range.

SUMMARY OF THE INVENTION

Exemplary embodiments of the present invention overcome the above disadvantages and other disadvantages not described above. Also, the present invention is not required to overcome the disadvantages described above, and some exemplary embodiments may not overcome any of the problems described above.

The present invention provides a photographing apparatus capable of generating vibrations in a wider frequency range using a simpler circuit, and a vibration control method thereof.

According to an aspect of the present invention, a photographing apparatus includes a supporting member which supports a photographing element or an image sensor, a vibration means which vibrates an optical member provided on a front surface of the photographing element, and a control means which controls vibrations generated by the vibration means in order to remove dust off the optical member, wherein the control means controls the vibration means to vibrate the optical member and the supporting member with two types of frequencies, wherein the two types of frequencies are larger and smaller than a first frequency which corresponds to a natural frequency of the optical member by a size of a second frequency which corresponds to a natural frequency of the supporting member.

According to another aspect of the present invention, a vibration control method includes controlling vibrations of a vibration means, which vibrates a supporting member that supports a photographing element or an image sensor, and an optical member provided on a front surface of the photographing element, wherein in the controlling process, the vibration means vibrates the optical member and the supporting member with two different frequencies, wherein the two different frequencies are larger and smaller than a first frequency which is around a natural frequency of the optical member by a size of a second frequency which is around a natural frequency of the supporting member.

According to another aspect of the present invention, a photographing apparatus includes an image sensor; an optical member provided on a front surface of the image sensor; a resin substrate on which the image sensor is provided thereon; first and second piezoelectric elements provided at both ends of the resin substrate; and a dust removing unit which vibrates the resin substrate and the optical member by driving the first and second piezoelectric elements with two different frequencies, wherein the two different frequencies are larger and smaller than a first frequency which is around a natural frequency of the optical member by a size of a second frequency which is around a natural frequency of the resin substrate.

Additional and/or other aspects and advantages of the invention will be set forth in part in the description which follows and, in part, will be obvious from the description, or may be learned by practice of the invention.

BRIEF DESCRIPTION OF THE DRAWING FIGURES

The above and/or other aspects of the present invention will be more apparent by describing certain exemplary embodiments of the present invention with reference to the accompanying drawings, in which.

DETAILED DESCRIPTION OF THE EXEMPLARY EMBODIMENTS

Figure 1:
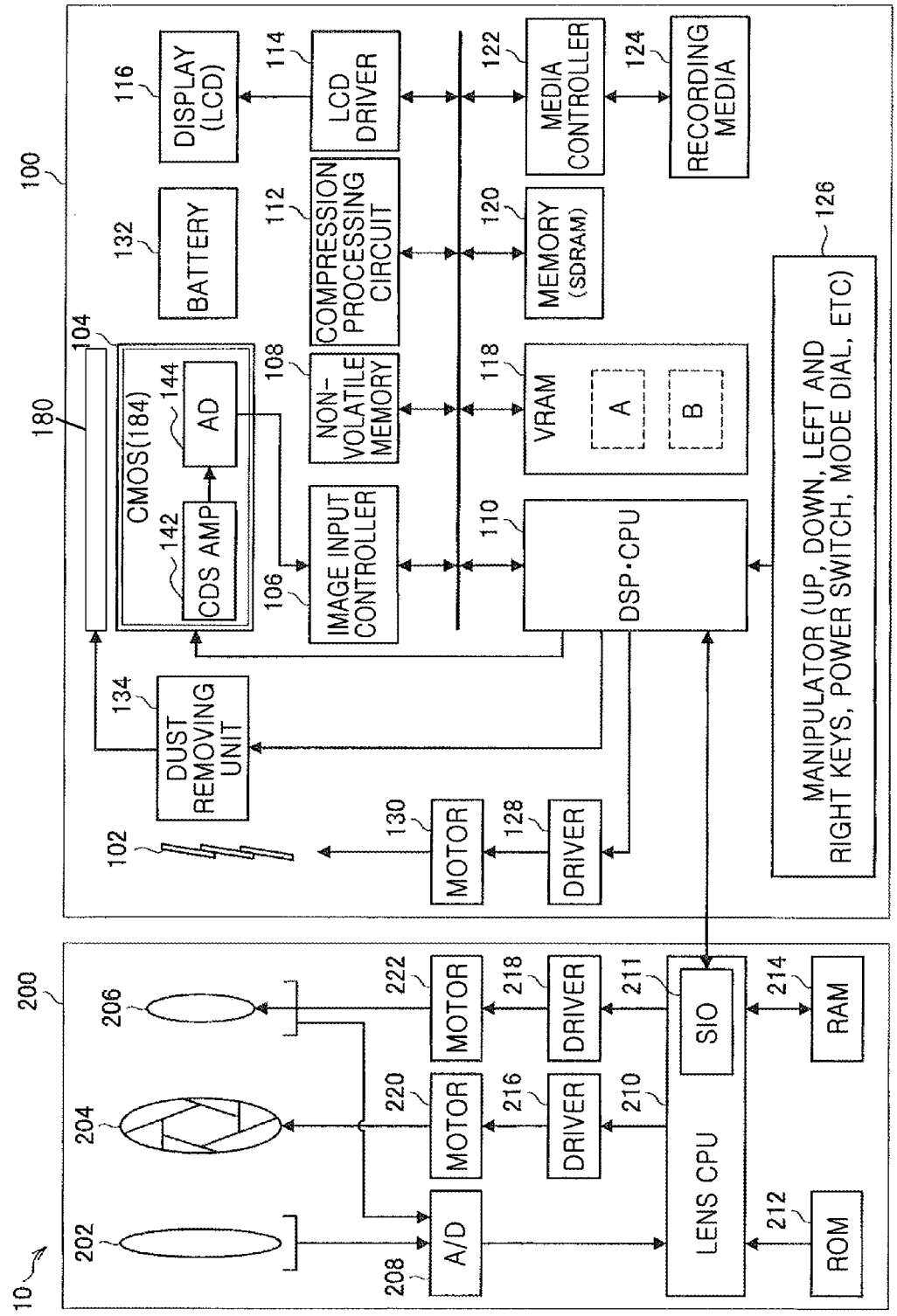
FIG. 1 is a block diagram of a configuration of a photographing apparatus according to an exemplary embodiment of the present invention.

Certain exemplary embodiments of a photographing apparatus, a vibration control apparatus, and a vibration control method according to the present invention will now be described in greater detail with reference to the accompanying drawings.

In the following description, same drawing reference numerals are used for the same elements even in different drawings. The matters defined in the description, such as detailed construction and elements, are provided to assist in a comprehensive understanding of the invention. Thus, it is apparent that the exemplary embodiments of the present invention can be carried out without those specifically defined matters. For the purposes of clarity and simplicity, well-known functions or constructions are not described in detail as they would obscure the invention with unnecessary detail.

FIG. 1 is a block diagram of a configuration of a photographing apparatus according to an exemplary embodiment of the present invention.

As shown in FIG. 1, the photographing apparatus 10 according to an exemplary embodiment of the present invention may include a main body 100 and a lens unit 200.

The main body 100 may include a shutter 102, a complementary metal-oxide semiconductor (CMOS) image sensor 104, an image input controller 106, a non-volatile memory 108, a DSP/CPU 110, a compression processing circuit 112, a liquid crystal display (LCD) driver 114, a display 116, a video random-access memory (VRAM) 118, a memory 120, a medium controller 122, a recording medium 124, a manipulator 126, a driver 128, a motor 130, a battery 132, and a dust removing unit 134.

The lens unit 200 may include a zoom lens 202, an aperture 204, a focus lens 206, an analog digital (AD) converter 208, a lens central processing unit (CPU) 210, a read-only memory (ROM) 212, a random-access memory (RAM) 214, drivers 216 and 218, and motors 220 and 222.

Firstly, the components of the main body 100 are described.

In operation, the shutter 102 adjusts a duration of an incident light entering the lens unit 200. In this exemplary embodiment, the shutter 102 is an electronic shutter and thus adjusts the duration by controlling an output of an electrical signal to control the incident light. However, in another exemplary embodiment, it is possible to use a mechanical shutter.

The CMOS image sensor 104 converts light entering from the lens unit 200 into an electrical signal. The CMOS image sensor 104 may include a CDS circuit 142 and an AD converter 144. The CDS circuit 142 is a sampling type circuit to remove noise of an electrical signal output from the CMOS image sensor 104, and an amplifier for amplifying the electrical signal after the noise is removed. In the exemplary embodiment, the photographing apparatus 10 includes a circuit which incorporates the CDS circuit and the amplifier in a single body, but it is also possible to separate the CDS circuit and the amplifier on different circuits. The AD converter 144 generates image data by converting the electrical signal generated by the CMOS image sensor 104 into a digital signal.

The image input controller 106 controls the input of the image data generated by the AD converter 144. The non-volatile memory 108 stores an execution program to control the photographing apparatus 10, or management information which is needed to control the photographing apparatus 10. In the exemplary embodiment, the non-volatile memory 108 stores lens identification information to identify the lens unit 200, and scene mode information which may be selected by the photographing apparatus 10 when the lens unit 200 is mounted on the main body 100, in relation to the lens unit 200.

The DSP/CPU 110 performs commands of a signal system for the CMOS image sensor 104 and the CDS circuit 142, and performs commands of a manipulation system using the manipulator 126. In the exemplary embodiment, the DSP/CPU 110 is formed in a single body as shown in FIG. 1, but it is also possible for separate controllers, the CPU and the DSP, to perform respective commands for the signal system and the manipulation system.

The compression processing circuit 112 compresses an image, of which the amount of light is gain-compensated and of which white balance is adjusted, into image data of an appropriate form. The compression form of the image may be reversible or irreversible form. The compression form of the image may be Joint Photographic Experts Group (JPEG) format.

The display 116 displays a scene captured by a lens before photographing, a screen for diverse settings of the photographing apparatus 10, or a screen displaying a photographed image. Image data and diverse information of the photographing apparatus 10 are displayed on the display 116 by the LCD driver 114.

The VRAM 118 stores content displayed on the display 116. In addition, resolution and maximum color formation of the display unit 116 depend on the capacity of the VRAM 118.

The memory 120 temporarily stores a photographed image. The memory 120 has a storage capacity for storing a plurality of images. Storing an image in the memory 120 or reading from the memory 120 may be controlled by the image input controller 106. A semiconductor memory such as a synchronous dynamic random-access memory (SD RAM) may be used as the memory 120.

The recording medium 124 records an image captured by the photographing apparatus 10. Input to the recording medium 124 and output from the recording medium 124 are controlled by the medium controller 122. A memory card which is a card type recording device to record data in a flash memory may be used as the recording medium 124. In addition, the photographing apparatus 10 may be embedded with a communicating means for transmitting data to an external recording means, instead of the recording medium 124.

The manipulator 126 provides a plurality of elements to manipulate the photographing apparatus 10 or to perform diverse settings when capturing photograph images. The member provided on the manipulator 126 may include a power button, a cross-shaped key and a selection button to select photographing mode, a shutter button to take a photograph of a subject, etc.

The driver 128 controls driving of the motor 130 to operate the shutter 102. The battery 132 stores predetermined electrical power, and supplies the power to the main body 100 and the lens unit 200.

The dust removing unit 134 vibrates an element unit 180 in which an optical member 183 and the image sensor 104 are installed, so as to remove dust attached to the optical member 183, which is formed in front of the image sensor 104.

Now, the components of the lens unit 200 are described herein.

The zoom lens 202 may continuously change the focal distance by moving back and forth in the optical axis direction in order to change the size of a subject. The aperture 204 adjusts the amount of light entering the CMOS image sensor 104 of the main body 100 using the motor 220. The focus lens 206 adjusts the focus of the subject by moving back and forth in the optical axis direction using the motor 222.

With reference to FIG. 1, the single zoom lens 202 and the single focus lens 206 are shown for illustrative purposes, but it should be noted that the teachings of the present invention may be applicable to alternate embodiment having two or more zoom lenses 202 and two or more focus lenses 206.

The AD converter 208 converts location information of the zoom lens 202 and the focus lens 206 into digital information, and transmits the digital information to the lens CPU 210.

The lens CPU 210 controls the internal operation of the lens unit 200, and controls communication of information between the lens unit 200 and the main body 100. For example, the lens CPU 210 receives and interprets the digital location information of the zoom lens 202 and the focus lens 206, determines the location of the zoom lens 202 and the focus lens 206, and transmits the location information to the main body 100. In addition, the lens CPU 210 receives a command to designate the location or values of the zoom lens 202, the aperture 204, and the focus lens 206 from the main body 100, and then designates the location or values of the zoom lens 202, the aperture 204, and the focus lens 206.

The lens CPU 210 includes a SIO 211. The SIO 211 communicates with an SIO (not shown) of the DSP/CPU 110 of the main body 100 so that the lens unit 200 can communicate with the main body 100.

The ROM 212 stores a computer program to enable the lens CPU 210 to control operation of the lens unit 200, and diverse settings of the lens unit 200 (e.g., a type number, a serial number, etc. of a lens). The RAM 214 stores information changeable by operation of the lens unit 200.

The drivers 216 and 218 control the driving of the motors 220 and 222 to operate the aperture 204 and the focus lens 206, respectively. Since the drivers 216 and 218 operate the aperture 204 and the focus lens 206, the drivers 216 and 218 may adjust the size of the subject, the amount of light, and the focus.

Figure 2:
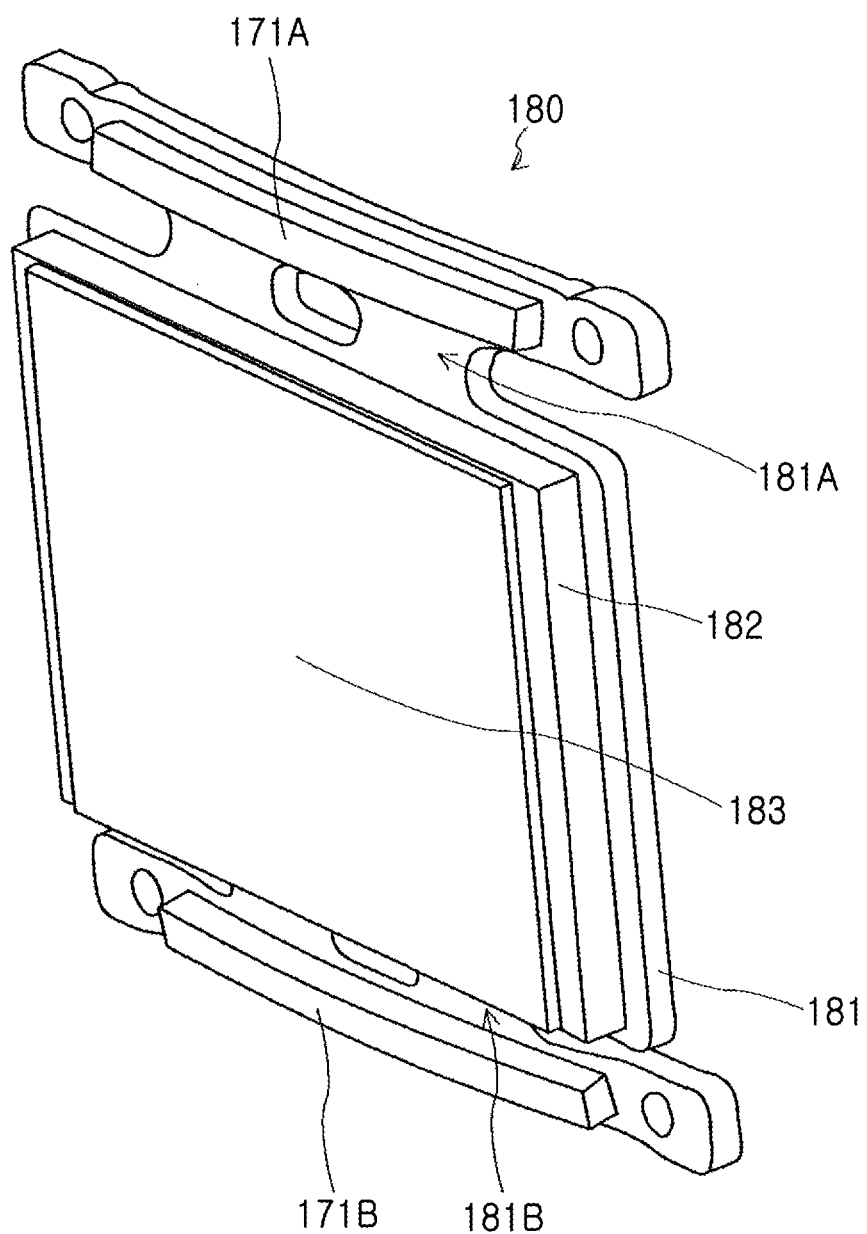
FIG. 2 is a perspective view of a configuration of the photographing apparatus according to an exemplary embodiment of the present invention.
Figure 3:
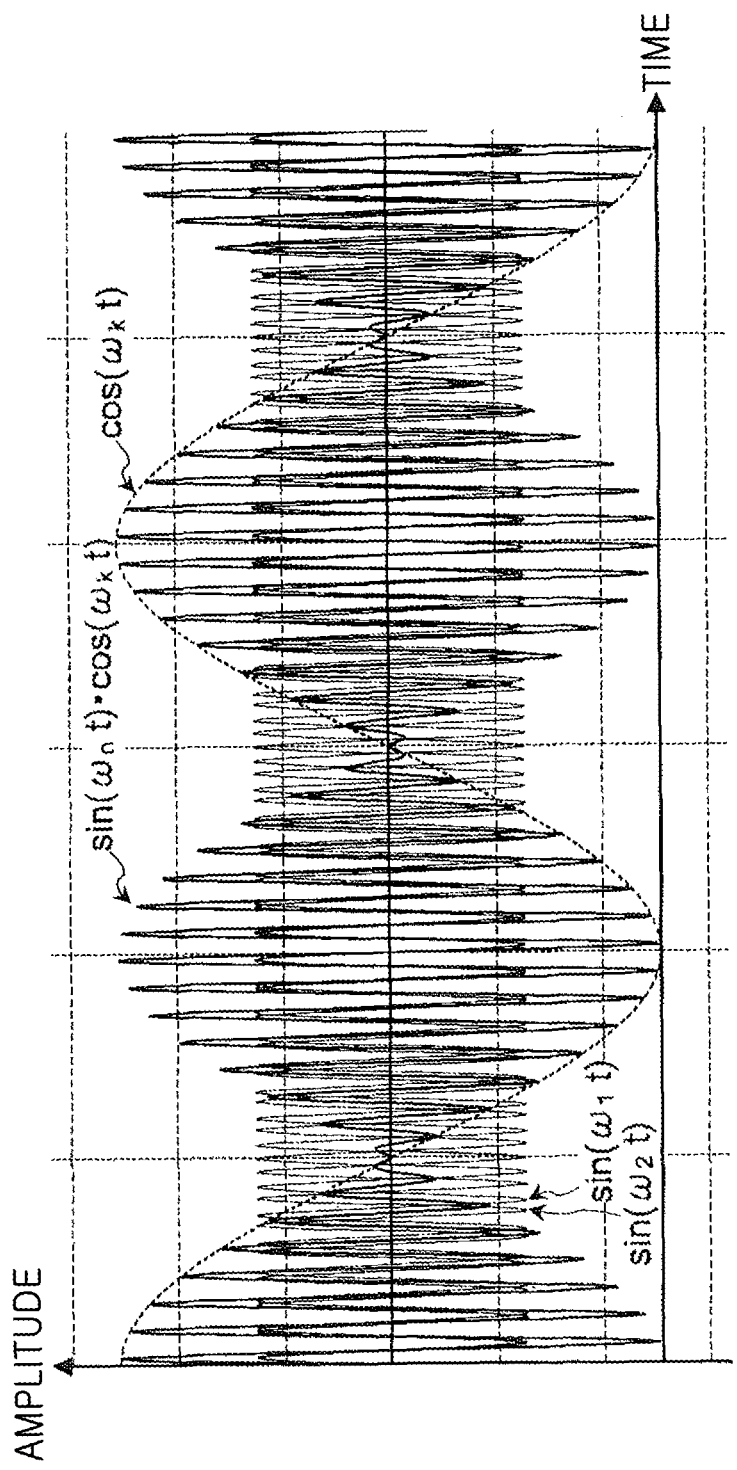
FIG. 3 is a graph illustrating a control method of a dust removing system according to an exemplary embodiment of the present invention.

A configuration of the element unit 180 to remove dust and a method for removing dust are described hereinafter with reference to FIGS. 2 and 3. FIG. 2 shows a perspective view of a configuration of the element unit 180. FIG. 3 shows a graph illustrating a method for removing dust from the element unit 180.

As shown in FIG. 2, the element unit 180 may include a resin substrate 181, a photographing element or device 182, an optical member 183, and piezoelectric elements 171A and 171B. The resin substrate 181 may include first and second supporting members 181A and 181B. The photographing element 182 corresponds to the CMOS image sensor 104 which has been described earlier.

In operation, the resin substrate 181 serves as a supporting member to support the photographing element 182, including a center area on which the photographing element 182 is provided, and two arm areas on which the first and second piezoelectric elements 171A and 171B are provided respectively. The center area is connected to the two arm areas through the first and second supporting members 181A and 181B. The resin substrate 181 is made of a resin material and has a lower natural frequency than the optical member 183. Note that natural frequency is the frequency at which an element or a system naturally vibrates once it has been set into motion.

More specifically, the natural frequency of the resin substrate 181 may be lowered by forming the width of the first and second supporting members 181A and 181B narrower than other areas, i.e., the center area and the arm areas, and providing an opening at a center portion of the first and second supporting members 181A and 181B. That is, the first and second supporting members 181A and 181B which support the center area of the resin substrate 181 on which the optical member 183 and the photographing element 182 are installed may be formed in a more easily bendable structure than the center area of the optical member. At this time, when a vibration frequency is set around the natural frequency of the first and second supporting members 181A and 181B, it is possible to slowly and greatly vibrate or oscillate (move back and forth) the entire element unit 180 including the optical member 183 on a low frequency.

The optical member 183 is provided on a front surface of the photographing element 182 and serves as a dustproof member to prevent dust from being attached on the photographing element 182. The optical member 183 is made of a harder or more rigid material than the resin substrate 181. Thus, the resin substrate 181 (i.e., the supporting member) is made of a more flexible or softer material than the optical member 183. For example, the optical member 183 may be made of glass or a high hard resin material through which light can pass. For this reason, the natural frequency of the optical member 183 is higher than that of the resin substrate 181. Accordingly, the element unit 180 is vibrated on a frequency around the natural frequency of the resin substrate 181 while the element unit 180 vibrates on a frequency around the natural frequency of the optical member 183.

The piezoelectric elements 171A and 171B serve to remove dust attached to the optical member 183 by vibrating the optical member 183. In the exemplary embodiment, the two piezoelectric elements 171A and 171B are used for illustrative purposes, and are respectively provided on the two arm areas of the resin substrate 181 as shown in FIG. 2. That is, the two piezoelectric elements 171A and 171B are symmetrically provided on the two sides of the optical member 183 provided on the center of the resin substrate 181.

The piezoelectric elements 171A and 171B may control the frequency using a step-up transformer. In particular, when the frequency of the piezoelectric elements 171A and 171B is controlled using the step-up transformer, a characteristic of the step-up transformer of determining a response-available band according to factors such as winding, material, and load needs to be considered. Since there is a limit to a driving band of the step-up transformer, it is difficult to realize the aforementioned two natural frequencies by changing the driving frequency of the step-up transformer as long as a particular circuit is not formed.

To overcome the above problem, the teachings of the present invention provides method for concurrently vibrating the optical member 183 and the resin substrate 181 which have the largely different natural frequencies, by driving the two piezoelectric elements 171A and 171B without using a particular circuit. Accordingly, it is possible to generate vibration as described above using a cheap and small-size circuit structure step-up transformer. As a result, manufacturing cost may be saved and the photographing apparatus 10 may become smaller. Detailed description thereof is provided hereinafter.

Firstly, vibration characteristics are described.

For example, an angular frequency of the alternating current (AC) voltage supplied to the first piezoelectric element 171A is defined as $\omega_1$, and an angular frequency of the alternating current (AC) voltage supplied to the second piezoelectric element 171B is defined as $\omega_2$. However, the $n^{th}$ natural frequency (display the angular frequency) of the optical member 183 is $\omega_n$, the $k^{th}$ natural frequency (display the angular frequency) of the resin substrate 181 is $\omega_k$ ($\omega_k < \omega_n$), and angular frequencies $\omega_1$ and $\omega_2$ are defined by Equations 1 and 2 shown below. On this condition, when the first and second piezoelectric elements 171A and 171B are driven, complex vibration as in Equation 3 occurs in the element unit 180.

Finally, the $n^{th}$ natural vibration and the $k^{th}$ natural vibration are generated in the element unit 180 at the same time. Herein, for simplicity, vibration amplitudes of the first and second piezoelectric elements 171A and 171B are the same value, A, but even when the vibration amplitudes are different values, the same complex vibration can be acquired. For reference, FIG. 3 shows two sine waveforms including the angular frequencies expressed in Equations 1 and 2 in phase and a vibration waveform expressed as Equation 3 which includes the two sine waveforms. A high frequency component corresponding to angular frequency $\omega_n$ and a low frequency component corresponding to angular frequency $\omega_k$ may be expressed as shown in FIG. 3 using the aforementioned method.

$$\omega_1 = \omega_n + \omega_k \qquad \text{[Equation 1]}$$

$$\omega_2 = \omega_n - \omega_k \qquad \text{[Equation 2]}$$

$$A\sin(\omega_1 t) + A\sin(\omega_2 t) = A\sin\{(\omega_n + \omega_k)t\} + A\sin\{(\omega_n - \omega_k)t\} \qquad \text{[Equation 3]}$$
$$= 2A\sin(\omega_n t) \cdot \cos(\omega_k t)$$

The configuration of the element unit 180 and the method for removing dust have been described in the above. As described above, it is simple to drive of the voltage applied to the first and second piezoelectric elements 171A and 171B. Accordingly, the optical member 183 and the resin substrate 181 which have largely different natural frequencies can be effectively vibrated by complex vibration induced to the element unit 180.

Next, a configuration and operation of the dust removing unit 134 which removes foreign substances such as dust attached to the optical member 183 by controlling vibration of the element unit 180 is described herein in detail. Note that the dust removing unit 134 is a control means which controls vibration applied to the optical member 183 by controlling a vibration applying means, such as the piezoelectric elements 171.

Figure 4:
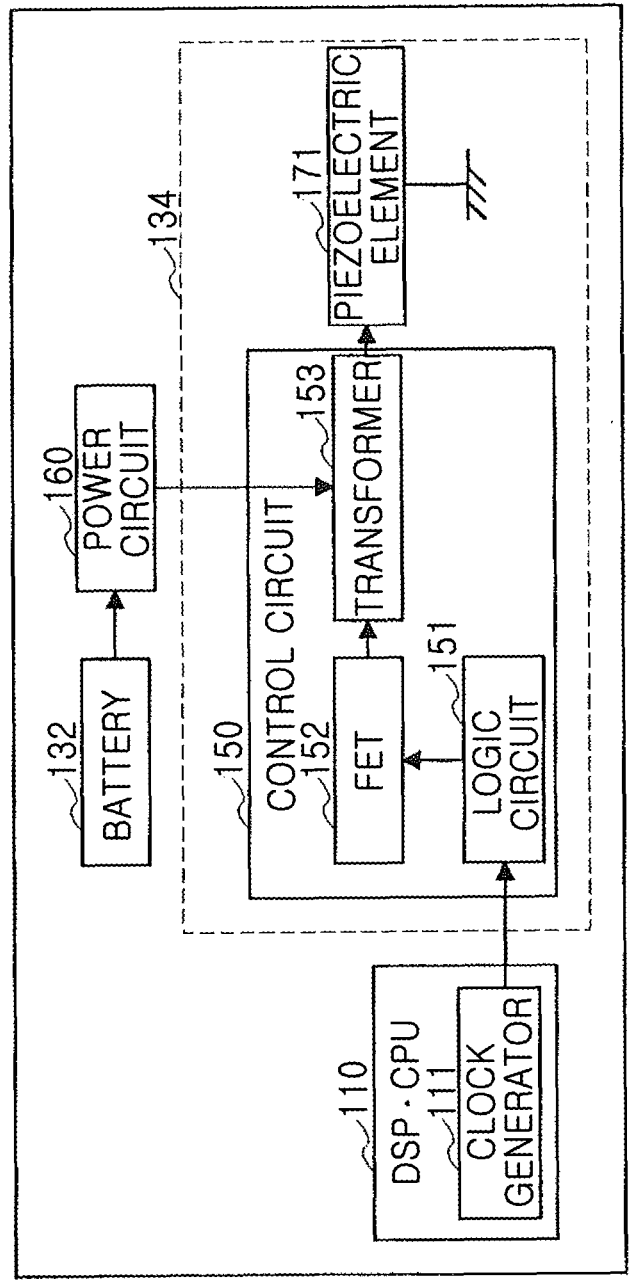
FIG. 4 is a block diagram of a configuration of a control apparatus which controls a dust removing system according to an exemplary embodiment of the present invention.

FIG. 4 is a block diagram of a functional configuration of the dust removing unit 134 with associated components.

As shown in FIG. 4, the dust removing unit 134 may include a control circuit 150. The control circuit 150 may include a logic circuit 151, a field-effect transistor (FET) 152, and a transformer 153.

In addition, the DSP/CPU 110 may include a clock generator 111. The clock generator 111 generates a pulse width modulation (PWM) signal and outputs the PWM signal to the logic circuit 151 of the control circuit 150. The logic circuit 151 receives the PWM signal generated by the clock generator 111, and outputs the PWM signal to the FET 152. The FET 152 is connected to a primary side of the transformer 153. When the FET 152 receives the PWM signal from the logic circuit 151, the transformer 153 generates a signal of a secondary side having a predetermined periodicity by switching operation of the FET 152.

The transformer 153 receives power from the battery 132 through a power circuit 160, and applies the voltage having the periodicity to the piezoelectric elements 171. For example, the voltage having the periodicity corresponding to aforementioned frequencies $\omega_1$ or $\omega_2$ may be applied to the piezoelectric elements 171. As shown in FIG. 2, when voltages of frequencies $\omega_1$ and $\omega_2$ are applied to the two piezoelectric elements 171A and 171B, respectively, the element unit 180 is excited to the frequencies $\omega_1$ and $\omega_2$ so that complex vibration can be generated in the element unit 180.

Next, operation of the dust removing unit 134 is described hereinafter. Since the basic vibration control method has been described with reference to FIG. 3, operation regarding frequency sweep in consideration of temperature environment and manufacturing deviation is described hereinafter.

Figure 5:
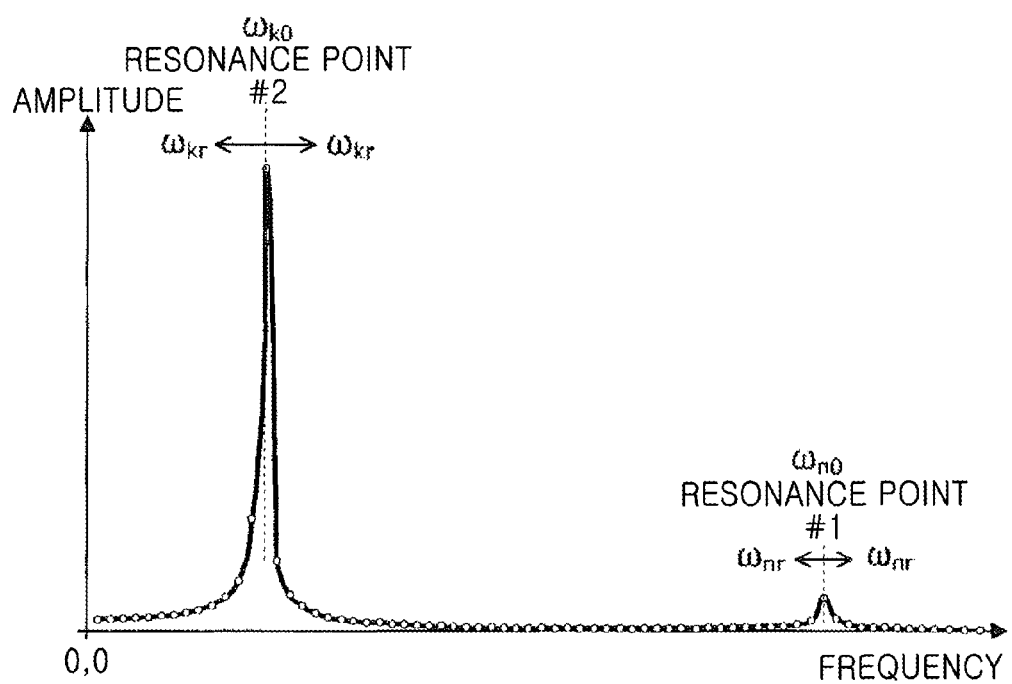
FIG. 5 illustrates an example of operation (sweeping operation) of a control apparatus which controls a dust removing system according to an exemplary embodiment of the present invention.

In a case of a vibrating object, such as the element unit 180, which includes two members 183 and 181 having largely different natural frequencies, a vibration characteristic having a peak at two resonance points (resonance points #1 and #2) may be acquired as shown in FIG. 5. However, FIG. 5 illustrates that on reference conditions (e.g., at room temperature), a resonant frequency of the optical member 183 is $\omega_{n0}$, and a resonant frequency of the resin substrate 181 is $\omega_{k0}$. In addition, $\omega_{kr}$ and $\omega_{nr}$ in FIG. 5 indicate sweeping bands based on resonance points #1 and #2, respectively. As a result, the dust removing unit 134 can vary frequency in the sweeping bands as shown in FIG. 5.

Figure 6:
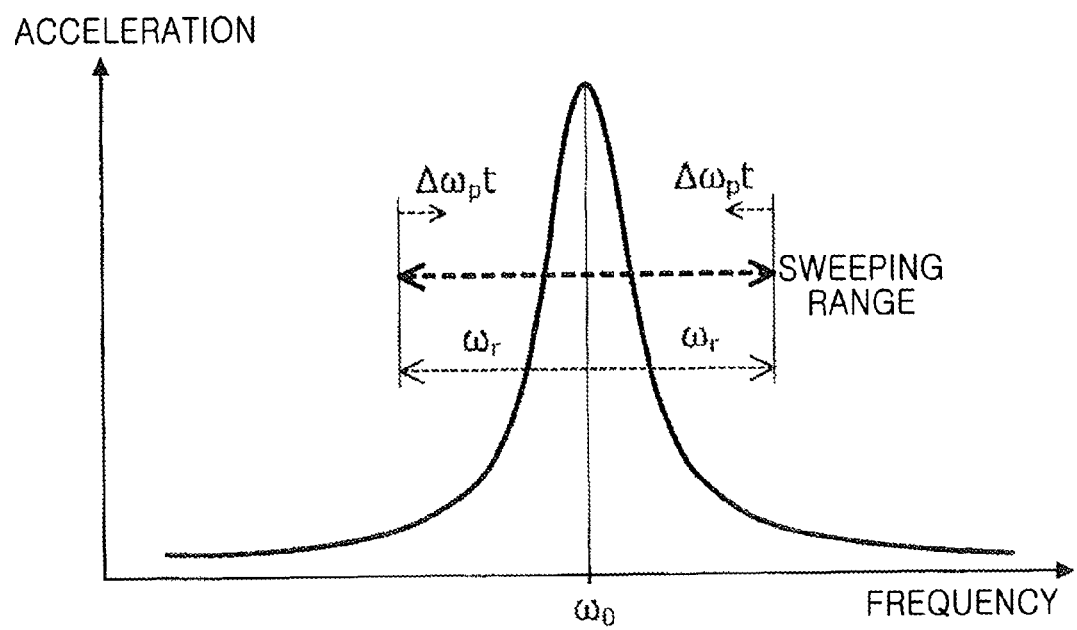
FIG. 6 illustrates an example of operation (sweeping operation) of a control apparatus which controls a dust removing system according to an exemplary embodiment of the present invention.

Herein, for simplicity, when it is assumed that a frequency at the resonance point is $\omega_0$, a sweeping band at the resonance point is $\omega_r$, and an amount of change in frequency per a unit control time is $\Delta\omega_p$, the dust removing unit 134 may vary the frequency as shown in FIG. 6 using Equation 4 below.

$$\omega = \omega_0 \pm \omega_r \mp \Delta\omega_p t \text{ (the double signs are arranged in the shown order).} \qquad \text{[Equation 4]}$$

If sweeping of the resonance points #1 and #2 are performed, $\omega_n$ varies by $\Delta\omega_{np}$ and $\omega_k$ varies by $\Delta\omega_{kp}$ per a unit time. Accordingly, complex vibration applied to the element unit 180 is expressed as in Equation 5 below. However, angular frequencies $\omega_1$ and $\omega_2$ of the voltages applied to the first and second piezoelectric elements 171A and 171B may be expressed as Equations 6 and 7, respectively. Hence, in the real-life situation considering temperature environment and manufacturing deviation, the dust removing unit 134 vibrates the first and second piezoelectric elements 171A and 171B in accordance with Equation 5. The desired complex vibration can be obtained by this structure.

$$2A\sin\{(\omega_{n0}\pm\omega_{nr}\mp\Delta\omega_{np}t)t\}\cdot\cos\{(\omega_{k0}\pm\omega_{kr}\mp\Delta\omega_{kp}t)t\} \qquad \text{[Equation 5]}$$

$$\omega_1 = (\omega_{n0}\pm\omega_{nr}\mp\Delta\omega_{np}t) + (\omega_{k0}\pm\omega_{kr}\mp\Delta\omega_{kp}t) \qquad \text{[Equation 6]}$$

$$\omega_2 = (\omega_{n0}\pm\omega_{nr}\mp\Delta\omega_{np}t) - (\omega_{k0}\pm\omega_{kr}\mp\Delta\omega_{kp}t) \qquad \text{[Equation 7]}$$

wherein A denotes a vibration amplitude, $\omega_1$ denotes an angular frequency of the AC voltage supplied to the first piezoelectric element 171A, $\omega_2$ denotes an angular frequency of the AC voltage supplied to the second piezoelectric element 171B, $\omega_{n0}$ denotes a frequency of the resonance point of the optical member 183, $\omega_{nr}$ denotes a sweeping band of the resonance point of the optical member 183, $\Delta\omega_{np}$ denotes an amount of change in frequency of the optical member 183 per a unit time, $\omega_{k0}$ denotes a frequency of the resonance point of the resin substrate 181, $\omega_{kr}$ denotes a sweeping band of the resonance point of the resin substrate 181, $\Delta\omega_{kp}$ denotes an amount of change in frequency of the resin substrate 181 per a unit time, and t denotes a time.

By controlling vibration as described above, it is possible to make the optical member 183 having a high natural frequency and the resin substrate 181 having a low natural frequency in resonance state at the same time. In particular, it is possible to provide vibrations to remove dust without shaking of acceleration for the optical member 183 by resonating the resin substrate 181 (in particular, the first and second supporting members 181A and 181B) which supports the optical member 183. As a result, foreign substances such as dust attached onto the optical member 183 may be effectively removed. In addition, since the step-up transformer is used in the driving circuit of the piezoelectric elements, manufacturing cost may be saved and the photographing apparatus 10 may become smaller.

According to the exemplary embodiment of the present invention, the vibration state may become efficient since resonance vibration is applied to the optical member 183 provided on the front surface of the photographing element 182 and is applied to the resin substrate 181 which is a basis of the optical member 183, dust removing ability may be more enhanced than a conventional method. In addition, since the optical member 183 vibrates together with the basis (corresponding to the resin substrate 181, the optical member 183 may realize vibration state regardless of nodes and antinodes of vibration related to the natural vibration of the optical member 183. Furthermore, the optical member 183 may be incorporated with the photographing element 182 so that a vibration unit (corresponding to the element unit 180) may become thinner.

In addition, according to the exemplary embodiment of the present invention, a general circuit may be used. In other words, since the driving circuit of the piezoelectric element is on the premise of high voltage driving by the step-up transformer, and the step-up transformer is used in transient state, there is a physical limit to a band capable of obtaining a desired step-up rate. When the resonance frequency of a member which is a basis of the optical member is far smaller than the resonance frequency of the optical member, and only the basis is resonated, the transformer becomes a normal state so that desired driving voltage may not be obtained. However, according to the exemplary embodiment of the present invention, since a frequency band which is around the resonance frequency of the optical member is used, it is possible to vibrate the optical member on a desired frequency together with a member having a totally different resonance frequency without a particular transformer.

In the above exemplary embodiments of the present invention, two piezoelectric elements are used for illustrative purposes. However, although only a single piezoelectric element is provided as long as the single piezoelectric element is driven on two frequencies.

The above-described methods according to the present invention can be implemented in hardware, firmware or as software or computer code that can be stored in a recording medium such as a CD ROM, an RAM, a floppy disk, a hard disk, or a magneto-optical disk or computer code downloaded over a network originally stored on a remote recording medium or a non-transitory machine readable medium and to be stored on a local recording medium, so that the methods described herein can be rendered in such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein.

The foregoing exemplary embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A photographing apparatus comprising:
   a supporting member for supporting a photographing device;
   an optical member provided on a front surface of the photographing device for preventing dust from being attached onto the photographing device;
   a vibration means coupled to the support member and the optical member; and
   a control means for controlling the vibration means, which vibrates the optical member and the supporting member with two different frequencies for removing dust off the optical member, wherein one of the two different frequencies is larger than a first frequency which is around a natural frequency of the optical member by a size of a second frequency which is around a natural frequency of the supporting member, and the other one of the two different frequencies is smaller than a first frequency which is around a natural frequency of the optical member by a size of a second frequency which is around a natural frequency of the supporting member.

2. The photographing apparatus as claimed in claim 1, wherein the first frequency is greater than the second frequency.

3. The photographing apparatus as claimed in claim 2, wherein the control means controls the vibration means to vibrate the optical member and the supporting member on a first driving frequency obtained by subtracting the second frequency from the first frequency and on a second driving frequency obtained by adding the second frequency to the first frequency.

4. The photographing apparatus as claimed in claim 1, wherein the supporting member is made of a resin material and has a lower natural frequency than the optical member.

5. The photographing apparatus as claimed in claim 1, wherein the optical member is made of a glass material and has a higher natural frequency than the supporting member.

6. The photographing apparatus as claimed in claim 3, wherein the control means sweeps the first driving frequency and the second driving frequency.

7. The photographing apparatus as claimed in claim 1, wherein the supporting member is made of a more flexible material than the optical member.

8. A vibration control method comprising:
   providing an image sensor between an optical member and a supporting member and first and second piezoelectric elements provided at both ends of the supporting member; and
   vibrating the optical member and the supporting member with two different frequencies for removing dust off the optical member, wherein a first driving frequency is around a sum of a natural frequency of a resin substrate and a natural frequency of the optical member and a second driving frequency is around a difference between the natural frequency of the optical member and the natural frequency of the resin substrate.

9. The vibration control method as claimed in claim 8, wherein the supporting member is made of a resin material and has a lower natural frequency than the optical member.

10. The vibration control method as claimed in claim 8, wherein the optical member is made of a glass material and has a higher natural frequency than the supporting member.

11. A photographing apparatus comprising:
an image sensor;
an optical member, provided on a front surface of the image sensor, for preventing dust from being attached onto the photographing apparatus;
a resin substrate on which the image sensor is provided thereon;
first and second piezoelectric elements provided at both ends of the resin substrate; and
a dust removing unit which vibrates the resin substrate and the optical member by driving the first and second piezoelectric elements with two different frequencies for removing the dust off the photographing apparatus, wherein a first frequency is around a sum of a natural frequency of the resin substrate and a natural frequency of the optical member and a second frequency is around a difference between the natural frequency of the optical member and the natural frequency of the resin substrate.

12. The photographing apparatus as claimed in claim 11, wherein the resin substrate is made of a resin material and has a lower natural frequency than the optical member.

13. The photographing apparatus as claimed in claim 11, wherein the optical member is made of a glass material and has a higher natural frequency than the resin substrate.

14. The photographing apparatus as claimed in claim 11, wherein the dust removing unit applies an alternating current (AC) voltage having a following angular frequency to the first piezoelectric element, $$\omega_1 = \omega_n + \omega_k$$

and applies an alternating current (AC) voltage having a following angular frequency to the second piezoelectric element, $$\omega_2 = \omega_n - \omega_k$$

wherein $\omega_1$ denotes an angular frequency of the AC voltage supplied to the first piezoelectric element, $\omega_2$ denotes an angular frequency of the AC voltage supplied to the second piezoelectric element, $\omega_n$ denotes an $n^{th}$ natural frequency of the optical member, and $\omega_k$ denotes a $k^{th}$ natural frequency of the resin substrate.

15. The photographing apparatus as claimed in claim 11, wherein the dust removing unit applies an alternating current (AC) voltage having a following angular frequency to the first piezoelectric element, $$\omega_1 = (\omega_{n0} \pm \omega_{nr} \mp \Delta\omega_{np} t) + (\omega_{k0} \pm \omega_{kr} \mp \Delta\omega_{np} t)$$

and applies an alternating current (AC) voltage having a following angular frequency to the second piezoelectric element, $$\omega_2 = (\omega_{n0} \pm \omega_{nr} \mp \Delta\omega_{np} t) - (\omega_{k0} \pm \omega_{kr} \mp \Delta\omega_{kp} t)$$

wherein $\omega_1$ denotes an angular frequency of the AC voltage supplied to the first piezoelectric element, $\omega_2$ denotes an angular frequency of the AC voltage supplied to the second piezoelectric element, $\omega_{n0}$ denotes a frequency of a resonance point of the optical member, $\omega_{nr}$ denotes a sweeping band of the resonance point of the optical member, $\Delta\omega_{np}$ denotes an amount of change in frequency of the optical member per a unit time, $\omega_{k0}$ denotes a frequency of a resonance point of the resin substrate, $\omega_{kr}$ denotes a sweeping band of the resonance point of the resin substrate, $\Delta\phi_{kp}$ denotes an amount of change in frequency of the resin substrate per a unit time, and t denotes a time.

16. The photographing apparatus as claimed in claim 11, wherein the resin substrate comprises:
a center area on which the image sensor is provided;
first and second supporting members which extend from the center area at an opposite direction; and
first and second arm areas which are connected to the first and second supporting members, respectively, and on which the first and second piezoelectric elements are provided,
wherein a width of the first and second supporting members is narrower than a width of the center area and the first and second arm areas.

17. The photographing apparatus as claimed in claim 16, wherein the first and second supporting members each have at least one opening at a center portion thereof.

* * * * *

UNITED STATES PATENT AND TRADEMARK OFFICE
CERTIFICATE OF CORRECTION

PATENT NO.       : 9,113,058 B2
APPLICATION NO.  : 13/862812
DATED            : August 18, 2015
INVENTOR(S)      : Jun Komada et al.

It is certified that error appears in the above-identified patent and that said Letters Patent is hereby corrected as shown below:

In The Claims

Column 12, Claim 15, Line 22 should read as follows:
--...substrate, $\Delta\omega_{kp}$ denotes an...--

Signed and Sealed this
Twenty-ninth Day of December, 2015

Michelle K. Lee
*Director of the United States Patent and Trademark Office*

UNITED STATES PATENT AND TRADEMARK OFFICE
CERTIFICATE OF CORRECTION

PATENT NO. : 9,113,058 B2
APPLICATION NO. : 13/862812
DATED : August 18, 2015
INVENTOR(S) : Jun Komada et al.

It is certified that error appears in the above-identified patent and that said Letters Patent is hereby corrected as shown below:

In the Claims
Column 12, Claim 15, Line 7 should read as follows:

--... $\omega_1 = (\omega_{n0} \pm \omega_{nr} \mp \Delta\omega_{np}t) + (\omega_{k0} \pm \omega_{kr} \mp \Delta\omega_{kp}t)$ ...--

Signed and Sealed this
Fifth Day of July, 2016

Michelle K. Lee
*Director of the United States Patent and Trademark Office*